US011942020B2

(12) United States Patent
Kim et al.

(10) Patent No.: US 11,942,020 B2
(45) Date of Patent: Mar. 26, 2024

(54) DRIVING CIRCUIT, FOUR-STAGE DRIVING CIRCUIT AND DISPLAY PANEL

(71) Applicant: HKC CORPORATION LIMITED, Shenzhen (CN)

(72) Inventors: Byung Hoon Kim, Shenzhen (CN); Zhaoyang Lu, Shenzhen (CN); Sahng Ik Jun, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/877,651

(22) Filed: Jul. 29, 2022

(65) Prior Publication Data

US 2023/0032248 A1  Feb. 2, 2023

(30) Foreign Application Priority Data

Jul. 30, 2021  (CN) .......................... 202110884711.X

(51) Int. Cl.
*G09G 3/20* (2006.01)

(52) U.S. Cl.
CPC ... *G09G 3/2096* (2013.01); *G09G 2300/0404* (2013.01); *G09G 2300/0809* (2013.01); *G09G 2310/0294* (2013.01)

(58) Field of Classification Search
CPC ......... G09G 3/2096; G09G 2300/0404; G09G 2300/0809
See application file for complete search history.

(56) References Cited

U.S. PATENT DOCUMENTS

| 10,269,290 B2 * | 4/2019 | Shang ................... G09G 3/3677 |
| 11,132,934 B2 * | 9/2021 | Xie ......................... G11C 19/28 |
| 2017/0221436 A1 * | 8/2017 | Guo ...................... G09G 3/3607 |
| 2020/0202967 A1 * | 6/2020 | Hu ........................ G09G 3/2092 |

(Continued)

FOREIGN PATENT DOCUMENTS

| CN | 105118419 A | 12/2015 |
| CN | 106448588 A | 2/2017 |

(Continued)

OTHER PUBLICATIONS

First Office Action issued in counterpart Chinese Patent Application No. 202110884711.X, dated Feb. 8, 2022.

*Primary Examiner* — Towfiq Elahi
(74) *Attorney, Agent, or Firm* — Westbridge IP LLC

(57) ABSTRACT

Disclosed is a driving circuit including an input circuit, a first output circuit, a second output circuit and a pull-down circuit. Control terminals of the first output circuit and the second output circuit are connected with an output terminal of the input circuit and receive a control signal from the input circuit, and output terminals of the first output circuit and the second output circuit are connected with the pull-down circuit and receive a pull-down signal. Thus, two stages of driving signals output by one stage driving circuit is realized. As compared with the existing architecture under which the two stage driving circuit is needed to output two stages of driving signals, one input circuit and one pull-down circuit are removed. This application also discloses a four-stage driving circuit and a display panel. The number of used components is reduced, and the frame of the display product is narrowed.

16 Claims, 8 Drawing Sheets

(56) References Cited

U.S. PATENT DOCUMENTS

2021/0225312 A1\* 7/2021 Han .................... G09G 3/3677
2021/0335200 A1\* 10/2021 Yuan .................... G09G 3/3677
2021/0358361 A1\* 11/2021 Luo ........................ G09G 3/20

FOREIGN PATENT DOCUMENTS

| CN | 107221299 A | 9/2017 |
|----|-------------|--------|
| CN | 107689219 A | 2/2018 |
| CN | 109272960 A | 1/2019 |
| CN | 109461401 A | 3/2019 |
| CN | 110164391 A | 8/2019 |
| CN | 110390903 A | 10/2019 |
| CN | 110648638 A | 1/2020 |
| CN | 111754925 A | 10/2020 |
| CN | 111986609 A | 11/2020 |
| CN | 112382249 A | 2/2021 |
| CN | 112820234 A | 5/2021 |

\* cited by examiner

DRIVING CIRCUIT, FOUR-STAGE DRIVING CIRCUIT AND DISPLAY PANEL

CROSS-REFERENCE TO RELATED APPLICATIONS

This application claims priority to Chinese Patent Application No. 202110884711.X, filed on Jul. 30, 2021. The disclosures of the aforementioned application are incorporated in this application by reference in its entirety.

TECHNICAL FIELD

The present application relates to the field of display, and in particular, to a driving circuit, a four-stage driving circuit and a display panel.

BACKGROUND

The liquid crystal display has been used widely for it's numerous advantages such as thin body, power saving, no radiation and the like. With the improvement of the living, people have higher requirements, such as lower price and narrower frame, etc. on the display products.

At present, in order to reduce the product cost, the Gate Driver Less (GDL) driving technology is usually adopted in the manufacturing process. Therefore, the two sides of the display panel do not need to be driven by a chip, and the product cost is greatly reduced. However, due to a large number of thin film transistors are used, the frame of the display product is wider, and the pursuit of the consumer on the narrow frame display product is not met.

The above content is only used to assist in understanding the technical solution of the present application, and it does not represent an admission that the above-mentioned content is prior art.

SUMMARY

The main object of the present application is to provide a driving circuit, a four-stage driving circuit and a display panel, and aims to solve the problem that the frame of the display product is wider and does not meet the market demand.

In order to achieve the above object, the present disclosure provides a driving circuit, including:
an input circuit configured to output a control signal upon receiving a trigger signal;
a first output circuit including a control terminal connected to an output terminal of the input circuit, and configured to output a first output signal upon receiving the control signal and a first input signal;
a second output circuit including a control terminal connected to the output terminal of the input circuit and configured to output a second output signal upon receiving the control signal and a second input signal; and
a pull-down circuit including:
an input terminal connected to the output terminal of the input circuit, an output terminal of the first output circuit and an output terminal of the second output circuit; and
an output terminal connected to a first low level voltage and configured to pull down the control signal, the first output signal and the second output signal to a low level when a pull-down control signal is at a high level, and stop pulling down the control signal, the first output signal and the second output signal when the trigger signal or the control signal is at the high level.

In an embodiment, the input circuit includes a first switching transistor, and the first switching transistor includes:
a control terminal configured to receive the trigger signal;
an input terminal connected to the control terminal; and
an output terminal connected to the control terminal of the first output circuit, the control terminal of the second output circuit, and the input terminal of the pull-down circuit.

In an embodiment, the first output circuit includes:
a second switching transistor including:
a control terminal connected to the output terminal of the input circuit;
an input terminal configured to receive the first input signal; and
an output terminal configured to output the first output signal; and
the second output circuit includes:
a third switching transistor including:
a control terminal connected to the output terminal of the input circuit;
an input terminal configured to receive the second input signal; and
an output terminal configured to output the second output signal.

In an embodiment, the first output circuit further includes a first capacitor, one terminal of the first capacitor is connected to the control terminal of the second switching transistor, and another terminal of the first capacitor is connected to the output terminal of the second switching transistor; and
the second output circuit further includes a second capacitor, one terminal of the second capacitor is connected to the control terminal of the third switching transistor, and another terminal of the second capacitor is connected to the output terminal of the third switching transistor.

In an embodiment, the driving circuit further includes a cascading-down circuit having a control terminal connected to the output terminal of the input circuit, and the cascading-down circuit is configured to output a cascading-down signal upon receiving the control signal and the first input signal.

In an embodiment, the cascading-down circuit includes a fourth switching transistor, and the fourth switching transistor includes:
a control terminal connected to the output terminal of the input circuit;
an input terminal of the fourth switching transistor configured to receive the first input signal; and
an output terminal configured to output the cascading-down signal.

In an embodiment, the pull-down circuit includes:
a pull-down holding circuit including an input terminal connected to the output terminal of the input circuit, and the pull-down holding circuit being configured to output a pull-down signal according to the pull-down control signal, and pull down the pull-down signal according to the trigger signal and the control signal; and
a pull-down sub-circuit including:
a control terminal connected to the output terminal of the pull-down holding circuit,
an input terminal connected to the output terminal of the input circuit, the output terminal of the first output circuit and the output terminal of the second output circuit; and an output terminal connected to the first low level voltage, and configured to pull down the control signal, the first output signal and the second output signal to the low level upon receiving the pull-down signal.

In an embodiment, the pull-down holding circuit includes:
a fifth switching transistor including:
a control terminal configured to receive the pull-down control signal;
an input terminal connected to the control terminal; and
an output terminal; and
a sixth switching transistor including:
an input terminal connected to the output terminal of the fifth switching transistor;
a control terminal connected to the output terminal of the input circuit; and
an output terminal connected to the first low level voltage;
a seventh switching transistor including:
a control terminal connected to the output terminal of the fifth switching transistor;
an input terminal configured to receive the pull-down control signal; and
an output terminal configured to output the pull-down signal;
an eighth switching transistor including:
a control terminal configured to receive the control signal;
an input terminal connected to the output terminal of the seventh switching transistor; and
a ninth switching transistor including:
a control terminal configured to receive the trigger signal;
an input terminal connected to the output terminal of the seventh switching transistor; and
an output terminal connected to the first low level voltage.

In an embodiment, the pull-down sub-circuit includes:
a tenth switching transistor including:
a control terminal configured to receive the pull-down signal;
an input terminal connected to the output terminal of the input circuit; and
an output terminal connected to the first low level;
an eleventh switching transistor including:
a control terminal configured to receive the pull-down signal;
an input terminal connected to the output terminal of the first output circuit;
an output terminal connected to a second low level; and
a twelfth switching transistor including:
a control terminal configured to receive the pull-down signal;
an input terminal connected to the output terminal of the second output circuit; and
an output terminal connected to the second low level.

In an embodiment, the pull-down sub-circuit further includes a thirteenth switching transistor, and the thirteenth switching transistor includes:
a control terminal configured to receive a first pull-down trigger signal;
an input terminal connected to the output terminal of the input circuit; and
an output terminal connected to the first low level.

In an embodiment, the pull-down sub-circuit further includes a fourteenth switching transistor, and the fourteenth switching transistor includes:
a control terminal configured to receive the pull-down signal;
an input terminal connected to an output terminal of the cascading-down circuit; and
an output terminal connected to the first low level voltage.

In an embodiment, the driving circuit further includes a reset circuit, the reset circuit includes a reset switching transistor and the reset switching transistor includes:
a control terminal configured to receive a reset signal;
an input terminal connected to the output terminal of the input circuit; and
an output terminal connected to the first low level voltage.

In addition, in order to achieve the above object, the present application further provides a driving circuit, which includes:
an input circuit configured to output a control signal upon receiving a trigger signal;
a first output circuit including a control terminal connected to an output terminal of the input circuit, and configured to output a first output signal upon receiving the control signal and a first input signal;
a second output circuit including a control terminal connected to the output terminal of the input circuit and configured to output a second output signal upon receiving the control signal and a second input signal; and
a pull-down circuit including:
an input terminal connected to the output terminal of the input circuit, an output terminal of the first output circuit and an output terminal of the second output circuit; and
an output terminal connected to a first low level voltage and configured to pull down the control signal, the first output signal and the second output signal to a low level when a pull-down control signal is at a high level, and stop pulling down the control signal, the first output signal and the second output signal when the trigger signal or the control signal is at the high level;
the pull-down circuit further includes:
a pull-down holding circuit comprising:
a fifth switching transistor including:
a control terminal configured to receive the pull-down control signal;
an input terminal connected to the control terminal; and
an output terminal; and
a sixth switching transistor including:
an input terminal connected to the output terminal of the fifth switching transistor;
a control terminal connected to the output terminal of the input circuit; and
an output terminal connected to the first low level voltage;
a seventh switching transistor including:
a control terminal connected to the output terminal of the fifth switching transistor;
an input terminal configured to receive the pull-down control signal; and
an output terminal configured to output the pull-down signal; and
an eighth switching transistor including:
a control terminal configured to receive the control signal;
an input terminal connected to the output terminal of the seventh switching transistor; and
a ninth switching transistor including:
a control terminal configured to receive the trigger signal;
an input terminal connected to the output terminal of the seventh switching transistor; and
an output terminal connected to the first low level voltage.

In addition, in order to achieve the above object, the present application further provides a four-stage driving circuit, which includes:
a first driving circuit including:

a first input circuit configured to output a first control signal upon receiving a first trigger signal;

a first output circuit including a control terminal connected to an output terminal of the first input circuit and configured to output a first output signal upon receiving the first control signal and a first input signal;

a second output circuit including a control terminal connected to the output terminal of the first input circuit and configured to output a second output signal upon receiving the first control signal and a second input signal are received; and a first pull-down circuit including:

an input terminal connected to the output terminal of the first input circuit, an output terminal of the first output circuit and an output terminal of the second output circuit; and an output terminal connected to a first low level voltage, and configured to pull the first control signal, the first output signal and the second output signal to a low level when a first pull-down control signal is at a high level, and stop pulling down the first control signal, the first output signal and the second output signal when the second control signal or the first control signal is at the high level; and a second driving circuit including:

a second input circuit configured to output a second control signal upon receiving a second trigger signal;

a third output circuit including a control terminal connected to an output terminal of the second input circuit and configured to output a third output signal upon receiving the second control signal and a third input signal;

a fourth output circuit including a control terminal connected to the output terminal of the second input circuit and configured to output a fourth output signal upon receiving the second control signal and a fourth input signal;

a second pull-down circuit including:

an input terminal connected to the output terminal of the second input circuit, an output terminal of the third output circuit, and an output terminal of the fourth output circuit; and an output terminal connected to the first low level voltage, and configured to pull down the second control signal, the third output signal and the fourth output signal to the low level when a second pull-down control signal is at the high level, and stop pulling down the second control signal, the third output signal and the fourth output signal when the first trigger signal, the second control signal or the first control signal is at the high level, the first pull-down control signal and the second pull-down control signal being opposite in voltage level.

In addition, in order to achieve the above object, the present application further provides a display panel which includes a display area and a non-display area, a plurality of pixel units are arranged on the display area, and the display panel further includes:

the driving circuit described above, the driving circuit being disposed on the non-display area to output a driving signal to drive the plurality of pixel units; or the four-stage driving circuit described above, the four-stage driving circuit being arranged on the non-display area to output a driving signal to drive the plurality of pixel units.

The driving circuit of the present disclosure includes an input circuit, a first output circuit, a second output circuit, and a pull-down circuit. The control terminal of the first output circuit and the control terminal of the second output terminal are connected to the output terminal of the input circuit and receive the control signal output by the input circuit. The output terminals of the first output circuit and the second output circuit are connected to the pull-down circuit and receive the pull-down signal. Thus, two stages of driving signals output by one stage driving circuit is realized. As compared with the existing architecture under which the two stage driving circuit is needed to output two stages of driving signals, one input circuit and one pull-down circuit are removed, which avoids using a large number of TFTs, and narrows the frame of the display product.

BRIEF DESCRIPTION OF THE DRAWINGS

In order to more clearly explain the embodiments of the present application or of the related art, the drawings used in the description of the embodiments or the related art will be briefly introduced below. Obviously, the drawings in the following description are merely some embodiments of the present application. For those of ordinary skill in the art, other drawings can be obtained based on the structure shown in these drawings without creative work.

Figure 1:
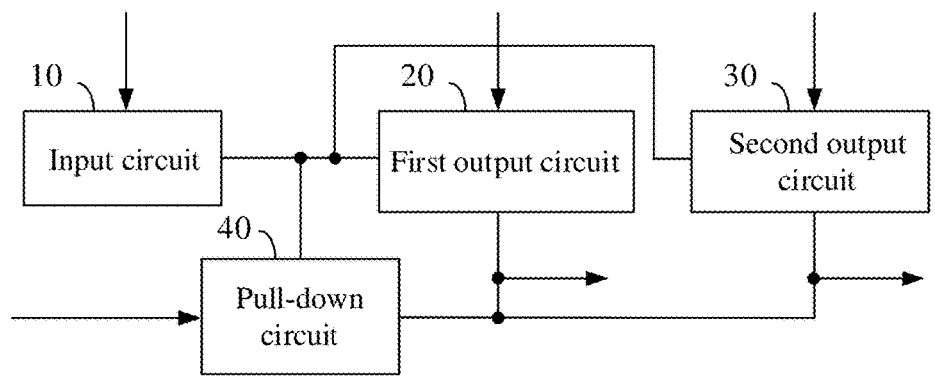
FIG. 1 is a schematic block diagram of a driving circuit according to an embodiment of the present disclosure.

The realization of the purposes, functional features and advantages of the present application will be further explained with reference to the accompanying drawings in combination with the embodiments.

DETAILED DESCRIPTION OF THE EMBODIMENTS

It should be understood that the specific embodiments described herein are merely used to explain the present disclosure, and are not intended to limit the present disclosure.

In the following, the embodiments of the present application will be clearly and completely described with reference to the drawings in the embodiments of the present application. Obviously, the described embodiments are only some of the embodiments of the present application, and not all of the embodiments. Based on the embodiments of the present application, all other embodiments obtained by those of ordinary skilled in the art without creative efforts shall fall within the claimed scope of the present application.

It should be noted that all directional indicators (such as up, down, left, right, front, back, etc.) in the embodiments of the present application are only used to explain the relative positional relationship, movement situation, etc. between components in a specific posture (as shown in the drawings). If the specific posture changes, the directional indication changes accordingly.

In addition, the descriptions related to "first," "second" and the like in the present application are for descriptive purposes only, and should not be understood as indicating or implying their relative importance or implicitly indicating the number of technical features indicated. Therefore, a feature defined by "first" and "second" may explicitly or implicitly include at least one of such feature. In addition, the meaning of "and/or" in the full text includes three parallel solutions, taking "A and/or B" as an example, it includes solution A, solution B, or both solutions A and B. The various embodiments can be combined with each other, but the combination must be based on what can be achieved by those of ordinary skill in the art. When the combination of the embodiments is contradictory or cannot be achieved, it should be considered that such a combination does not exist, or is not within the scope of the claims of the present application.

It can be understood that the display panel includes a plurality of pixels arranged in a matrix, a plurality of scan lines and a Gate Driver Less (GDL) driving circuit. The GDL circuit includes a plurality of driving units connected in sequence, and each driving unit is configured to generate and output a driving signal Gout. A first-stage Gout signal is provided to a first row of the pixel scanning lines, a second-stage Gout signal is provided to a second row of the pixel scanning lines, and so on, the Nth-stage Gout signal is provided to the nth row of the pixel scanning lines, and each pixel of the display panel is gated according to a corresponding Gout signal provided by a corresponding scanning line. In the existing GDL architecture, output of each stage needs a driving circuit, the number of TFTs is large, the structure is complex, and a narrow frame design is restricted.

According to the driving circuit, the four-stage driving circuit and the display panel provided by the present application, the GDL circuit structure is adjusted through a common Q-point mode, so that the number of the used TFTs is reduced, the frame of the display product is narrowed, the display area is increased, and the pursuit of people on the narrow frame is met.

The present disclosure provides a driving circuit. Referring to FIG. 1, in an embodiment, the driving circuit includes:
an input circuit 10 configured to output a control signal upon receiving a trigger signal;
a first output circuit 20, where a control terminal of the first output circuit 20 is connected to an output terminal of the input circuit 10, and the first output circuit 20 is configured to output a first output signal upon receiving the control signal and a first input signal;
a second output circuit 30, where a control terminal of the second output circuit 30 is connected to the output terminal of the input circuit 10, and the second output circuit 30 is configured to output a second output signal upon receiving the control signal and a second input signal; and
a pull-down circuit 40, where an input terminal of the pull-down circuit 40 is connected to the output terminal of the input circuit 10, an output terminal of the first output circuit 20 and an output terminal of the second output circuit 30, and an output terminal of the pull-down circuit 40 is connected to a first low level voltage, and the pull-down circuit 40 is configured to pull down the control signal, the first output signal and the second output signal to a low level when a pull-down control signal is at a high level, and stop pulling down the control signal, the first output signal and the second output signal when the trigger signal or the control signal is at the high level.

In this embodiment, the input circuit 10 receives a trigger signal and outputs a corresponding control signal; the first output circuit 20 outputs a first output signal upon receiving the control signal and a first input signal; and the second output circuit 30 outputs a second output signal upon receiving the control signal and a second input signal.

The pull-down circuit 40 receives a pull-down control signal, the trigger signal and the control signal, and pulls down the control signal, the first output signal and the second output signal to a low level when the pull-down control signal is at a high level. When the trigger signal or the control signal is at the high level, the output terminal of the pull-down circuit is pulled down to stop pulling down the control signal, the first output signal and the second output signal.

Since the control terminal of the first output circuit 20 and the control terminal of the second output circuit 30 are connected to the output terminal of the input circuit 10 and receive the control signal output by the input circuit 10, and the output terminal of the first output circuit 20 and the output terminal of the second output circuit 30 are connected to the pull-down circuit 40 and receive the pull-down signal, two stages of driving signals output by one stage driving circuit is realized under the GDL architecture. As compared with the architecture under which the two stage driving circuit is needed to output two stages of driving signals, one input circuit and one pull-down circuit are removed, which avoids to use a large number of TFTs, reduces the size of the GDL circuit board, and narrows the frame of the display product, thereby the user's requirement is met and the competitiveness of the product is improved.

Figure 2:
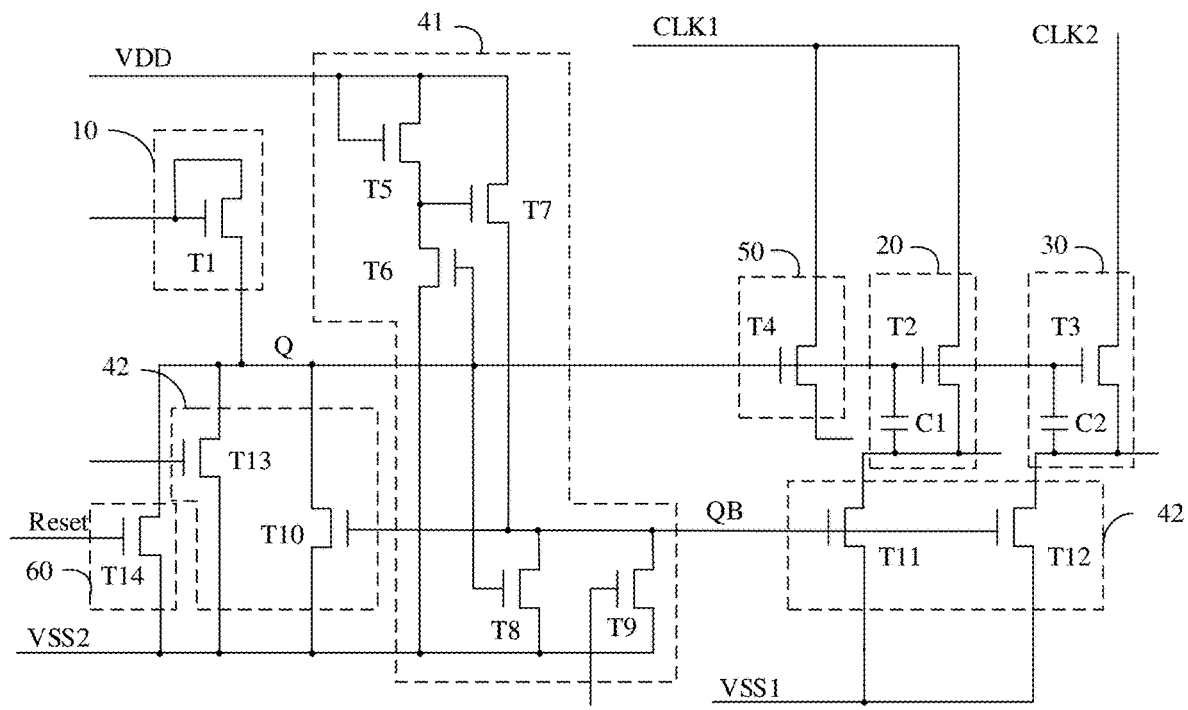
FIG. 2 is a schematic circuit diagram of the driving circuit according to an embodiment of the present disclosure.

Further, referring to FIG. 2, the structure of the input circuit 10 may be set according to actual needs. For example, the input circuit 10 may include a first switching transistor T1. A control terminal of the first switching transistor T1 is connected to the input terminal of the first switching transistor T1, and configured to receive a first trigger signal, and an output terminal of the first switching transistor T1 is connected to the control terminal of the first output circuit 20, the control terminal of the second output circuit 30, and the input terminal of the pull-down circuit 40.

When the first trigger signal is at the high level, the first switching transistor T1 is turned on, the control signal is at the high level, and the point Q is at the high level.

It should be noted that the first switching transistor T1 may be replaced by an equivalent circuit or an independent electronic component, and details are not described herein. Further, the type of the switching transistor may also be set according to actual needs, and the switching transistor may be a TFT.

Further, the structures of the first output circuit 20 and the second output circuit 30 may be set according to actual needs. For example, the first output circuit 20 may include a second switching transistor T2. A control terminal of the second switching transistor T2 is connected to the output terminal of the input circuit 10, an input terminal of the second switching transistor T2 is configured to receive the first input signal CLK1, and an output terminal of the second switching transistor T2 is configured to output the first output signal Gout(n).

The second output circuit 30 includes a third switching transistor T3. A control terminal of the third switching transistor T3 is connected to the output terminal of the input circuit 10, an input terminal of the third switching transistor T3 is configured to receive the second input signal CLK2, and an output terminal of the third switching transistor T3 is configured to output the second output signal Gout(n+1).

The control terminal of the second switching transistor T2 and the control terminal of the third switching transistor T3 are connected to the point Q. When the control signal is at the high level, the point Q is at the high level, and the second switching transistor T2 and the third switching transistor T3 are turned on. The second switching transistor T2 outputs Gout(n) according to a first clock signal CLK1, and the third switching transistor T3 outputs Gout(n+1) according to a second clock signal CLK2. The first input signal is the first clock signal CLK1, and the second input signal is the second clock signal CLK2. The first output signal is the driving signal Gout(n), and the second output signal is the driving signal Gout(n+1).

In addition, the first output circuit 20 further includes a first capacitor C1. One terminal of the first capacitor C1 is connected to the control terminal of the second switching transistor T2, and the other terminal of the first capacitor C1 is connected to the output terminal of the second switching transistor T2.

The second output circuit 30 further includes a second capacitor C2. One terminal of the second capacitor C2 is connected to the control terminal of the third switching transistor T3, and the other terminal of the second capacitor C2 is connected to the output terminal of the third switching transistor T3.

The first capacitor C1 and the second capacitor C2 are configured to maintain the voltage difference between the control terminal and the output terminal of the second switching transistor T2 and the voltage difference between the control terminal and the output terminal of the third switching transistor T3, to stabilize the outputs of the second switching transistor T2 and the third switching transistor T3.

Further, the driving circuit includes a cascading-down circuit 50, a control terminal of the cascading-down circuit 50 is connected to the output terminal of the input circuit 10, and configured to output a cascading-down signal upon receiving the first control signal and the first input signal.

The structure of the cascading-down circuit 50 may be set according to actual needs. For example, the cascading-down circuit 50 may include a fourth switching transistor T4. A control terminal of the fourth switching transistor T4 is connected to the output terminal of the input circuit 10, an input terminal of the fourth switching transistor T4 is configured to receive the first input signal CLK1, and an output terminal of the fourth switching transistor T4 is configured to output the cascading-down signal Carry(n).

Further, the pull-down circuit 40 includes a pull-down holding circuit 41 and a pull-down sub-circuit 42.

An input terminal of the pull-down holding circuit 41 is connected to the output terminal of the input circuit 10, and the pull-down holding circuit 41 is configured to output a pull-down signal according to the pull-down control signal, and pull down the pull-down signal according to the trigger signal and the control signal.

A control terminal of the pull-down sub-circuit 42 is connected to an output terminal of the pull-down holding circuit 41, and an input terminal of the pull-down sub-circuit 42 is connected to the output terminal of the input circuit 10, the output terminal of the first output circuit 20 and the output terminal of the second output circuit 30. An output terminal of the pull-down sub-circuit 42 is connected to a first low level voltage VSS2, and configured to pull down the control signal, the first output signal and the second output signal to the low level upon receiving the pull-down signal.

Further, the pull-down holding circuit 41 includes a fifth switching transistor T5, a sixth switching transistor T6, a seventh switching transistor T7, an eighth switching transistor T8 and a ninth switching transistor T9.

A control terminal of the fifth switching transistor T5 is connected to an input terminal of the fifth switching transistor T5, and configured to receive the pull-down control signal VDD, and an output terminal of the fifth switching transistor T5 is connected to an input terminal of the sixth switching transistor T6 and a control terminal of the seventh switching transistor T7. A control terminal of the sixth switching transistor T6 is connected to the output terminal of the input circuit 10, and an output terminal of the sixth switching transistor T6 is connected to the first low level voltage VSS2. An input terminal of the seventh switching transistor T7 is configured to receive the pull-down control signal VDD, and an output terminal of the seventh switching transistor T7 is connected to a pull-down point QB, and configured to output the pull-down signal. A control terminal of the eighth switching transistor T8 is configured to receive the control signal, and an input terminal of the eighth switching transistor T8 is connected to the pull-down point QB. An output terminal of the eighth switching transistor T8 is connected to the first low level voltage VSS2. A control terminal of the ninth switching transistor T9 is configured to receive the trigger signal, an input terminal of the ninth switching transistor T9 is connected to the pull-down point QB, and an output terminal of the ninth switching transistor is connected to the first low level voltage VSS2.

When the pull-down control signal VDD is at the high level, the fifth switching transistor T5 is turned on, and the seventh switching transistor T7 is turned on. The pull-down point QB is at the high level, and the pull-down signal is at the high level. The point Q is at the high level. The sixth switching transistor T6 is turned on, the control terminal of the seventh switching transistor T7 is at the low level, and the seventh switching transistor T7 is turned off. The control terminal of the eighth switching transistor T8 is at the high level, the eighth switching transistor T8 is turned on, and the pull-down point QB is at the low level. Thus, the situation that the control signal is at the high level while the pull-down signal is at the low level is realized, and the pulling down of voltages of the first output signal Gout(n), the second output signal Gout(n+1) and the point Q is stopped.

When the trigger signal received by the control terminal of the ninth switching transistor T9 is at the high level, the ninth switching transistor T9 is turned on, and the pull-down point QB is at the low level, which further ensures that the pull-down point QB is at the low level when the point Q is at the high level.

Further, the pull-down sub-circuit 42 includes a tenth switching transistor T10, an eleventh switching transistor T11, and a twelfth switching transistor T12.

A control terminal of the tenth switching transistor T10 is configured to receive the pull-down signal, an input terminal of the tenth switching transistor T10 is connected to the output terminal of the input circuit 10, and an output terminal of the tenth switching transistor T10 is connected to the first low level voltage VSS2.

A control terminal of the eleventh switching transistor T11 is configured to receive the pull-down signal, an input terminal of the eleventh switching transistor T11 is connected to the output terminal of the first output circuit 20, and an output terminal of the eleventh switching transistor T11 is connected to the second low level voltage VSS1.

A control terminal of the twelfth switching transistor T12 is configured to receive the pull-down signal, an input terminal of the twelfth switching transistor T12 is connected to the output terminal of the second output circuit 30, and an output terminal of the twelfth switching transistor T12 is connected to the second low level voltage VSS1.

Further, the pull-down sub-circuit 42 includes a thirteenth switching transistor T13. A control terminal of the thirteenth switching transistor T13 is configured to receive a first pull-down trigger signal, an input terminal of the thirteenth switching transistor T13 is connected to the output terminal of the input circuit 10, and an output terminal of the thirteenth switching transistor T13 is connected to the first low level voltage VSS2.

When the first pull-down trigger signal is at the high level, the thirteenth switching transistor T13 is turned on, and the voltage at the point Q is pulled down to the low level. When the pull-down point QB is at the high level, that is, the pull-down signal is at the high level, the tenth switching transistor T10 is turned on to pull down the voltage at the point Q. The eleventh switching transistor T11 is turned on, the voltage at the output terminal of the first output circuit 20 is pulled down to the low level. The twelfth switching transistor T12 is turned on, and the voltage at the output terminal of the second output circuit 30 is pulled down to the low level.

Further, the driving circuit includes a reset circuit 60. The reset circuit 60 includes a reset switching transistor T14. A control terminal of the reset switching transistor T14 is configured to receive a reset signal RESET, an input terminal of the reset switching transistor T14 is connected to the point Q, and an output terminal of the reset switching transistor T14 is connected to the first low level voltage VSS 2.

When the reset signal RESET is at the high level, the reset switching transistor T14 is turned on, and the voltage at the point Q is pulled down to the low level.

Based on the above hardware structure, the working process of the driving circuit may be that described at the following.

When the trigger signal is at the high level, the first switching transistor T1 is turned on. The point Q is at the high level, and the ninth switching transistor T9 is turned on. The pull-down point QB is at the low level, and the second switching transistor T2 is turned on, receives the first clock signal CLK1, and outputs the driving signal Gout(n+1). The fourth switching transistor T4 is turned on, receives the first clock signal CLK1, and outputs the cascading-down signal Carry(n). When the trigger signal is at the low level, the first switching transistor T1 is turned off, and the ninth switching transistor T9 is turned off. The first capacitor C1 and the second capacitor C2 are discharged. The second switching transistor T2 is turned on, receives the first clock signal CLK1, and outputs the driving signal Gout(n). The third switching transistor T3 is turned on, receives the second clock signal CLK2 and outputs the driving signal Gout(n+1). When the pull-down control signal VDD is at the high level, the fifth switching transistor T5 and the sixth switching transistor T6 are turned on, and the pull-down point QB is at the high level. The eleventh switching transistor T11 and the twelfth switching transistor T12 are turned on, and the driving signals Gout(n) and Gout(n+1) are pulled down to the low level.

In summary, based on the above hardware structure, the control terminal of the first output circuit 20 and the control terminal of the second output circuit 30 can be connected to the output terminal of the input circuit 10, and the output terminal of the first output circuit 20 and the output terminal of the second output circuit 30 are connected to the pull-down circuit 40. Through the manner of sharing the Q point, two stages of driving signals output by one stage driving circuit is realized. As compared with the architecture under which the two stage driving circuit is needed to output two stages of driving signals, one input circuit and one pull-down circuit are removed, which reduces the number of TFTs, narrows the frame of the display product, and reduces the manufacturing cost.

Figure 3:
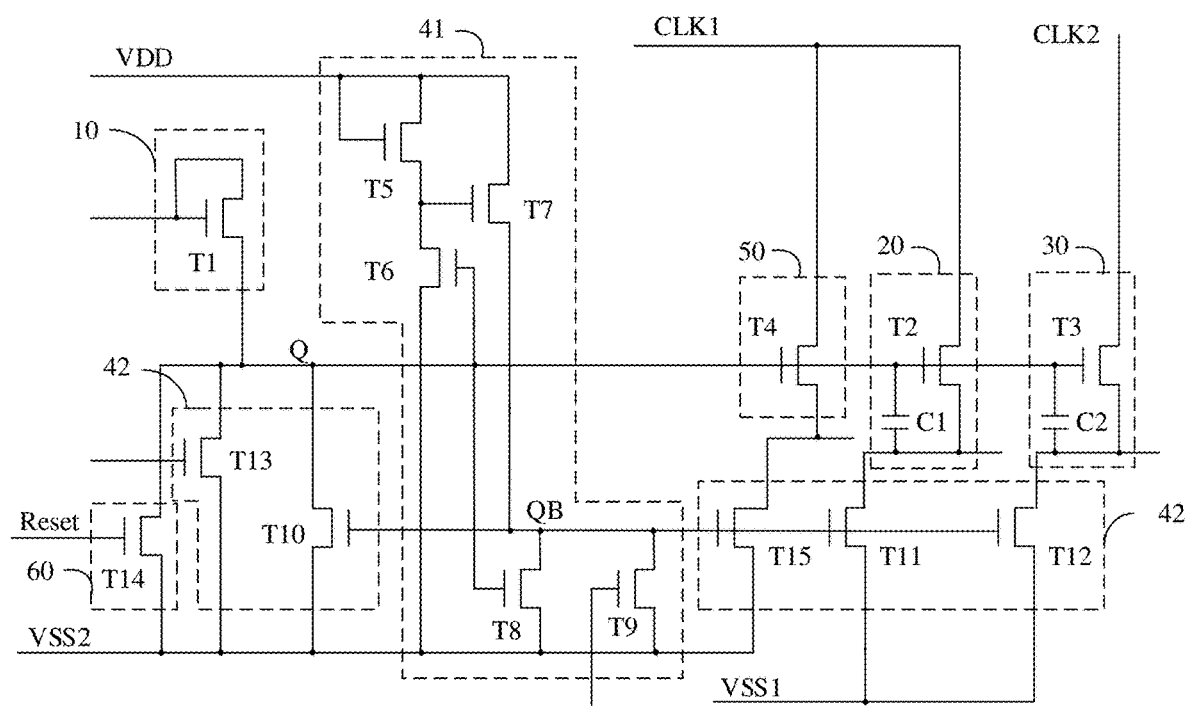
FIG. 3 is a schematic circuit diagram of the driving circuit according to another embodiment of the present application.

Referring to FIG. 3, in another embodiment of the driving circuit of the present disclosure, the pull-down sub-circuit 42 further includes a fourteenth switching transistor T15. A control terminal of the fourteenth switching transistor T15 is configured to receive the pull-down signal, an input terminal of the fourteenth switching transistor T15 is connected to an output terminal of the cascading-down circuit 50, and an output terminal of the fourteenth switching transistor T15 is connected to the first low level voltage VSS2.

When the pull-down point QB is at the high level, the fourteenth switching transistor T15 is turned on to pull down the voltage at the output terminal of the cascading-down circuit 50.

A working process of the driving circuit may be shown below. When the trigger signal is at the high level, the first switching transistor T1 is turned on, and the point Q is at the high level. The ninth switching transistor T9 is turned on, and the pull-down point QB is at the low level. The second switching transistor T2 is turned on, receives the first clock signal CLK1, and outputs the driving signal Gout(n). The third switching transistor T3 is turned on, receives the second clock signal CLK2 and outputs the driving signal Gout(n+1). The fourth switching transistor T4 is turned on, receives the first clock signal CLK1, and outputs the cascading-down signal Carry(n). When the trigger signal is at the low level, the first switching transistor T1 is turned off, and the ninth switching transistor T9 is turned off. The first capacitor C1 and the second capacitor C2 are discharged, and the second switching transistor T2 is turned on, receives the first clock signal CLK1, and outputs the driving signal Gout(n). The third switching transistor T3 is turned on, receives the second clock signal CLK2 and outputs the driving signal Gout(n+1). When the pull-down control signal VDD is at the high level, the fifth switching transistor T5 and the sixth switching transistor T6 are turned on, and the pull-down point QB is at the high level. The eleventh switching transistor T11, the twelfth switching transistor T12 and the fourteenth switching transistor T15 are turned on, and the driving signals Gout(n) and Gout(n+1) and the cascading-down signal Carry(n) are pulled down to the low level.

In this embodiment, the control terminal of the first output circuit 20 and the control terminal of the second output circuit 30 are connected to the output terminal of the input circuit 10, and the output terminal of the first output circuit 20 and the output terminal of the second output circuit 30 are connected to the pull-down circuit 40. Through the manner of sharing the Q point, two stages of driving signals output by one stage driving circuit is realized. As compared with the architecture under which the two stage driving circuit is needed to output two stages of driving signals, one input circuit and one pull-down circuit are removed, which reduces the number of TFTs, narrows the frame of the display product, and improves the display effect.

Figure 4A:
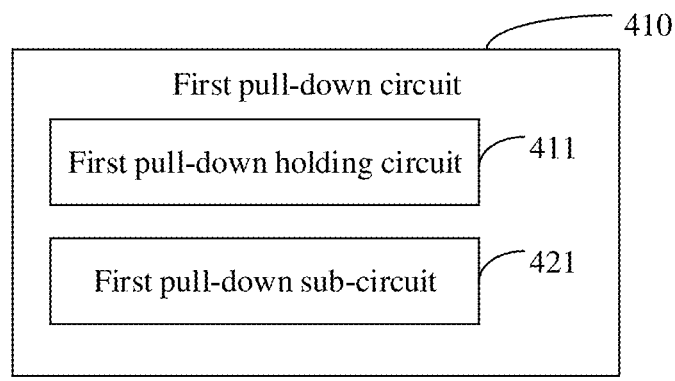
FIG. 4A is a schematic diagram of a first pull-down circuit of a four-stage driving circuit according to an embodiment of the present application.
Figure 4B:
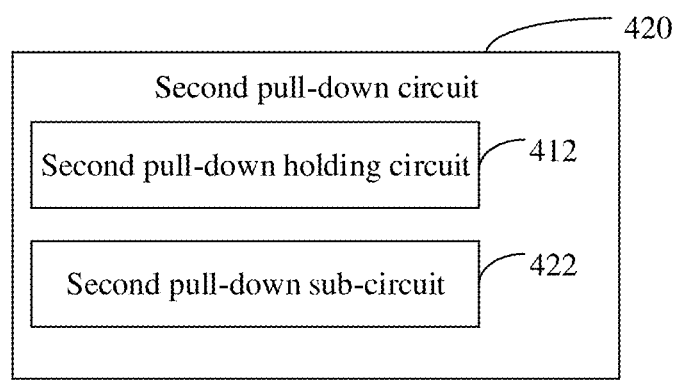
FIG. 4B is a schematic diagram of a second pull-down circuit of the four-stage driving circuit according to an embodiment of the present application.
Figure 4C:
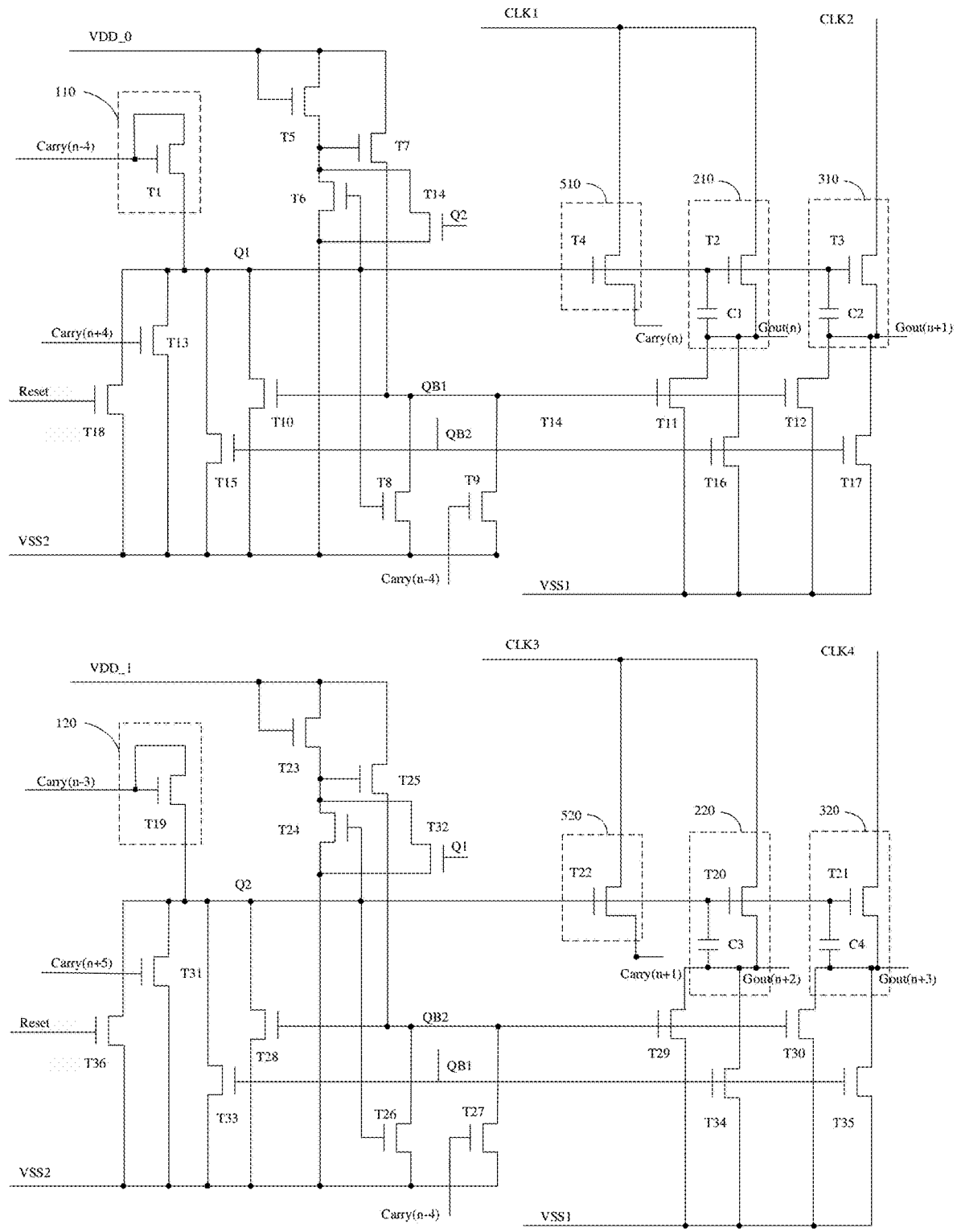
FIG. 4C is a schematic circuit diagram of the four-stage driving circuit according to an embodiment of the present application.

The present disclosure further provides a four-stage driving circuit. Referring to FIG. 4A to FIG. 4C, in an embodiment, the four-stage driving circuit includes a first driving circuit and a second driving circuit.

The first driving circuit includes:

a first input circuit 110 configured to output a first control signal upon receiving a first trigger signal Carry(n−4);

a first output circuit 210, where a control terminal of the first output circuit 210 is connected to an output terminal of the first input circuit 110, and the first output circuit 210 is configured to output a first output signal Gout(n) upon receiving the first control signal and a first input signal CLK1;

a second output circuit 310, where a control terminal of the second output circuit 310 is connected to an output terminal of the first input circuit 110, and the second output circuit 310 is configured to output a second output signal Gout(n+1) upon receiving the first control signal and a second input signal CLK2;

a first pull-down circuit 410, where an input terminal of the first pull-down circuit 410 is connected to an output terminal of the first input circuit 110, an output terminal of the first output circuit 210 and an output terminal of the second output circuit 310, and an output terminal of the first pull-down circuit 410 is connected to a first low level voltage, and configured to pull down the first control signal, the first output signal Gout(n) and the second output signal Gout(n+1) to a low level when a first pull-down control signal VDD_0 is at a high level, and stop pulling down the first control signal, the first output signal Gout(n) and the second output signal Gout(n+1) when the second control signal or the first control signal is at the high level.

The second driving circuit includes:

a second input circuit 120 configured to output a second control signal upon receiving a second trigger Carry (n−3) signal;

a third output circuit 220, where a control terminal of the third output circuit 220 is connected to an output terminal of the second input circuit 120, and configured to output a third output signal Gout(n+2) upon receiving the second control signal and a third input signal CLK3;

a fourth output circuit 320, where a control terminal of the fourth output circuit 320 is connected to the output terminal of the second input circuit 120, and configured to output a fourth output signal Gout(n+3) upon receiving the second control signal and a fourth input signal CLK4 are received;

a second pull-down circuit 420, where an input terminal of the second pull-down circuit 420 is connected to the output terminal of the second input circuit 120, an output terminal of the third output circuit 220 and an output terminal of the fourth output circuit 320, and an output terminal of the second pull-down circuit 420 is connected to a first low level voltage, and configured to pull down the second control signal, the third output signal Gout(n+2) and the fourth output signal Gout(n+3) to the low level when a second pull-down control signal VDD_1 is at the high level, and stop pulling down the second control signal, the third output signal Gout(n+2) and the fourth output signal Gout(n+3) when the first trigger signal Carry(n−4), the second control signal or the first control signal is at the high level, a voltage level of the first pull-down control signal VDD_0 and a voltage level of the second pull-down control signal VDD_1 are opposite to each other.

It can be understood that the voltage level of the first pull-down control signal VDD_0 and voltage level of the second pull-down control signal VDD_1 are opposite to each other, that is, when the first pull-down control signal VDD_0 is at the high level, the second pull-down control signal VDD_1 is at the low level.

In an embodiment, the first input circuit 110 may include a first switching transistor T1. A control terminal of the first switching transistor T1 is connected to an input terminal of the first switching transistor T1, and configured to receive the first trigger signal Carry(n−4), and an output terminal of the first switching transistor T1 is connected to the first point Q1.

When the first trigger signal Carry(n−4) is at the high level, the first switching transistor T1 is turned on, the first control signal is at the high level, and the first point Q1 is at the high level.

Further, the first output circuit 210 may include a second switching transistor T2. A control terminal of the second switching transistor T2 is connected to the first point Q1, an input terminal of the second switching transistor T2 is configured to receive the first input signal CLK1, and an output terminal of the second switching transistor T2 is configured to outputs the first output signal Gout(n).

The second output circuit 310 includes a third switching transistor T3, a control terminal of the third switching transistor T3 is connected to the first point Q1, an input terminal of the third switching transistor T3 is configured to receive the second input signal CLK2, and an output terminal of the third switching transistor T3 is configured to output the second output signal Gout(n+1).

The first output circuit 210 further includes a first capacitor C1. One terminal of the first capacitor C1 is connected to the control terminal of the second switching transistor T2, and the other terminal of the first capacitor C1 is connected to the output terminal of the second switching transistor T2.

The second output circuit 310 further includes a second capacitor C2. One terminal of the second capacitor C2 is connected to the control terminal of the third switching transistor T3, and the other terminal of the second capacitor C2 is connected to the output terminal of the third switching transistor T3.

The first capacitor C1 and the second capacitor C2 are mainly configured to maintain a voltage difference between the control terminal and the output terminal of the second switching transistor T2 and a voltage difference between the control terminal and the output terminal of the third switching transistor T3, to stabilize the outputs of the second switching transistor T2 and the third switching transistor T3.

The first driving circuit further includes a first cascading-down circuit 510. A control terminal of the first cascading-down circuit 510 is connected to the first point Q1, and the first cascading-down circuit 510 is configured to output a first cascading-down signal Carry(n) upon receiving the first control signal and the first input signal CLK1.

Further, the first-cascading-down circuit 510 may include a fourth switching transistor T4. A control terminal of the fourth switching transistor T4 is connected to the first point Q1, an input terminal of the fourth switching transistor T4 is configured to receive the first input signal CLK1, and an output terminal of the fourth switching transistor T4 is configured to output the first cascading-down signal Carry (n).

Further, the first pull-down circuit 410 includes a first pull-down holding circuit 411 and a first pull-down sub-circuit 421.

An input terminal of the first pull-down holding circuit 411 is connected to the first point Q1. The first pull-down holding circuit 411 is configured to output a first pull-down signal to the first pull-down point QB1 according to a first pull-down control signal VDD_0, and pull down the voltage at the first pull-down point QB1 according to the first trigger signal Carry(n−4) and the first control signal.

A control terminal of the first pull-down sub-circuit 421 is connected to an output terminal of the first pull-down holding circuit 411, an input terminal of the first pull-down sub-circuit 421 is connected to the first point Q1, the output terminal of the first output circuit 210 and the output terminal of the second output circuit 310, and an output terminal of the first pull-down sub-circuit 421 is connected to the first low level voltage VSS2, and configured to pull down the voltages of the first point Q1, the first output signal and the second output signal to the low level upon receiving the first pull-down signal.

Further, the first pull-down holding circuit 411 includes a fifth switching transistor T5, a sixth switching transistor T6, a seventh switching transistor T7, an eighth switching transistor T8, and a ninth switching transistor T9.

A control terminal of the fifth switching transistor T5 is connected to the input terminal of the fifth switching transistor T5, and configured to receive the first pull-down control signal VDD_0, an output terminal of the fifth switching transistor T5 is connected to an input terminal of the sixth switching transistor T6 and a control terminal of the seventh switching transistor T7. An output terminal of the sixth switching transistor T6 is connected to the first low level voltage VSS2. An input terminal of the seventh switching transistor T7 is configured to receive the first pull-down control signal VDD_0, an output terminal of the seventh switching transistor T7 is connected to the first pull-down point QB1, and configured to output a first pull-down signal. A control terminal of the eighth switching transistor T8 is configured to receive the first control signal. An input terminal of the eighth switching transistor T8 is connected to the first pull-down point QB1, and an output terminal of the eighth switching transistor T8 is connected to a first low level voltage VSS2. A control terminal of the ninth switching transistor T9 is configured to receive the first trigger signal Carry(n−4), an input terminal of the ninth switching transistor T9 is connected to the first pull-down point QB1, and an output terminal of the ninth switching transistor is connected to the first low level voltage VSS2.

When the first pull-down control signal VDD_0 is at the high level, the fifth switching transistor T5 is turned on, and the seventh switching transistor T7 is turned on. The first pull-down signal is at the high level, and the first pull-down point QB1 is at the high level. When the first point Q1 is at the high level, the sixth switching transistor T6 is turned on, and the control terminal of the seventh switching transistor T7 is at the low level. The seventh switching transistor T7 is turned off, and the control terminal of the eighth switching transistor T8 is at the high level. The eighth switching transistor T8 is turned on, and the first pull-down point QB8 is at the low level. Thus, the situation that the control signal is at the high level while the pull-down signal is at the low level is realized, and the pulling down of the voltages of the first output signal Gout(n), the second output signal Gout (n+1) and the point Q1 is stopped.

When the first trigger signal Carry(n−4) received by the control terminal of the ninth switching transistor T9 is at the high level, the ninth switching transistor T9 is turned on, and the first pull-down point QB1 is at the low level, which further ensures that the first pull-down point QB is at the low level when the point Q1 is at the high level.

Further, the first pull-down sub-circuit 421 includes a tenth switching transistor T10, an eleventh switching transistor T11, and a twelfth switching transistor T12.

A control terminal of the tenth switching transistor T10 is connected to the first pull-down point QB1, and configured to receive the first pull-down signal, an input terminal of the tenth switching transistor T10 is connected to the first point Q1, and an output terminal of the tenth switching transistor T10 is connected to the first low level voltage VSS2.

A control terminal of the eleventh switching transistor T11 is connected to the first pull-down point QB1, and configured to receive the first pull-down signal, an input terminal of the eleventh switching transistor T11 is connected to the output terminal of the first output circuit 210, and an output terminal of the eleventh switching transistor T11 is connected to the second low level voltage VSS1.

A control terminal of the twelfth switching transistor T12 is connected to the first pull-down point QB1, and configured to receive the first pull-down signal, an input terminal of the twelfth switching transistor T12 is connected to the output terminal of the second output circuit 310, and an output terminal of the twelfth switching transistor T12 is connected to the second low level voltage VSS1.

Further, the first pull-down sub-circuit 421 further includes a thirteenth switching transistor T13. A control terminal of the thirteenth switching transistor T13 and configured to receive a first pull-down trigger signal Carry (n+4), an input terminal of the thirteenth switching transistor T13 is connected to the first point Q1, and an output terminal of the thirteenth switching transistor T13 is connected to the first low level voltage VSS2.

When the first pull-down trigger signal Carry(n+4) is at the high level, the thirteenth switching transistor T13 is turned on, and the voltage at the first point Q1 is pulled down to the low level. When the first pull-down point QB1 is at the high level, that is, the first pull-down signal is at the high level, the tenth switching transistor T10 is turned on to pull down the voltage at the first point Q1. The eleventh switching transistor T11 is turned on, and the voltage at the output terminal of the first output circuit 210 is pulled down to the low level. The twelfth switching transistor T12 is turned on, and the voltage at the output terminal of the second output circuit 310 is pulled down to the low level.

The first pull-down holding circuit 411 further includes a fourteenth switching transistor T14. A control terminal of the fourteenth switching transistor T14 is connected to a second point Q2 of the second driving circuit, and configured to receive the second control signal, an input terminal of the fourteenth switching transistor T14 is connected to the input terminal of the sixth switching transistor T6, and an output terminal of the fourteenth switching transistor T14 is connected to the output terminal of the sixth switching transistor T6.

The first pull-down sub-circuit 421 further includes a fifteenth switching transistor T15, a sixteenth switching transistor T16, and a seventeenth switching transistor T17.

A control terminal of the fifteenth switching transistor T15 is connected to the second pull-down point QB2, and configured to receive the second pull-down signal, an input terminal of the fifteenth switching transistor T15 is connected to the first point Q1, and an output terminal of the fifteenth switching transistor T15 is connected to the first low level voltage VSS2.

A control terminal of the sixteenth switching transistor T16 is connected to the second pull-down point QB2, and configured to receive the second pull-down signal, an input terminal of the sixteenth switching transistor T16 is connected to the output terminal of the first output circuit 210, and an output terminal of the sixteenth switching transistor T16 is connected to the second low level voltage VSS1.

A control terminal of the seventeenth switching transistor T17 is connected to the second pull-down point QB2, and configured to receive the second pull-down signal, an input terminal of the seventeenth switching transistor T17 is connected to the output terminal of the second output circuit 310, and an output terminal of the seventeenth switching transistor T17 is connected to the second low level voltage VSS1.

When the second pull-down point QB2 is at the high level, that is, the second pull-down signal is at the high level, the fifteenth switching transistor T15 is turned on to pull down the voltage at the first point Q1. The sixteenth switching transistor T16 is turned on, the voltage at the output terminal of the first output circuit 210 is pulled down to the low level. The seventeenth switching transistor T17 is turned on, and the voltage at the output terminal of the second output circuit 310 is pulled down to the low level.

Further, the first driving circuit includes a first reset circuit, and the first reset circuit includes a reset switching transistor T18. A control terminal of the reset switching transistor T18 is configured to receive a reset signal Reset, an input terminal of the reset switching transistor T18 is connected to the first point Q1, and an output terminal of the reset switching transistor T18 is connected to the first low level voltage VSS2.

When the reset signal Reset is at the high level, the reset switching transistor T18 is turned on, and the voltage at the first point Q1 is pulled down to the low level.

Further, the second input circuit 120 may include a nineteenth switching transistor T19. A control terminal of the nineteenth switching transistor T19 is connected to the input terminal of the nineteenth switching transistor T19, and configured to receive a second trigger signal Carry(n−3), and an output terminal of the nineteenth switching transistor T19 is connected to the second point Q2.

When the second trigger signal Carry(n−3) is at the high level, the nineteenth switching transistor T19 is turned on, the second control signal is at the high level, and the second point Q2 is at the high level.

Further, the third output circuit 220 may include a twentieth switching transistor T20. A control terminal of the twentieth switching transistor T20 is connected to the second point Q2, an input terminal of the twenty-first switching transistor T20 is configured to receive the third input signal CLK3, and an output terminal of the twentieth switching transistor T20 is configured to output the third output signal Gout(n+2).

The fourth output circuit 320 includes a twenty-first switching transistor T21. A control terminal of the twenty-first switching transistor T21 is connected to the second point Q2, an input terminal of the twenty-first switching transistor T21 is configured to receive the fourth input signal CLK4, and an output terminal of the twenty-first switching transistor T21 is configured to output the fourth output signal Gout(n+3).

Further, the third output circuit 220 includes a third capacitor C3. One terminal of the third capacitor C3 is connected to the control terminal of the twenty-first switching transistor T20, and the other terminal of the third capacitor C3 is connected to the output terminal of the twenty-first switching transistor T20.

The fourth output circuit 320 further includes a fourth capacitor C4. One terminal of the fourth capacitor C4 is connected to the control terminal of the twenty-first switching transistor T21, and the other terminal of the fourth capacitor C4 is connected to the output terminal of the twenty-first switching transistor T21.

The third capacitor C3 and the fourth capacitor C4 are mainly configured to maintain a voltage difference between the control terminal and the output terminal of the twentieth switching transistor T20 and a voltage difference between the control terminal and the output terminal of the twenty-first switching transistor T21, to stabilize the outputs of the twentieth switching transistor T20 and the twenty-first switching transistor T21.

Further, the second driving circuit includes a second cascading-down circuit 520. A control terminal of the second cascading-down circuit 520 is connected to the second point Q2, and is configured to output a second cascading-down signal Carry(n+1) upon receiving the second control signal and the third input signal CLK3.

Further, the second cascading-down circuit 520 may include a twenty-second switching transistor T22. A control terminal of the twenty-second switching transistor T22 is connected to the second point Q2, an input terminal of the twenty-second switching transistor T22 is configured to receive the third input signal CLK3, and an output terminal of the twenty-second switching transistor T22 is configured to output the second-cascading-down signal Carry(n+1).

Further, the second pull-down circuit 420 includes a second pull-down holding circuit 412 and a second pull-down sub-circuit 422.

An input terminal of the second pull-down holding circuit 412 is connected to the second point Q2. The second pull-down holding circuit 412 is configured to output a second pull-down signal to the second pull-down point QB2 according to the second pull-down control signal VDD_1, and pull down the voltage at the second pull-down point QB2 according to the first trigger signal Carry(n−4) and the second control signal.

A control terminal of the second pull-down sub-circuit 422 is connected to an output terminal of the second pull-down holding circuit 412, an input terminal of the second pull-down sub-circuit 422 is connected to the second point Q2, the output terminal of the third output circuit 220 and the output terminal of the fourth output circuit 320, and an output terminal of the second pull-down sub-circuit 422 is connected to a first low level voltage VSS2, and configured to pull down the voltages of the second point Q2, the third output signal and the fourth output signal to the low level upon receiving the second pull-down signal.

Further, the second pull-down holding circuit 412 includes a twenty-third switching transistor T23, a twenty-fourth switching transistor T24, a twenty-fifth switching transistor T25, a twenty-sixth switching transistor T26, and a twenty-seventh switching transistor T27.

A control terminal of the twenty-third switching transistor T23 is connected to an input terminal of the twenty-third switching transistor T23, and configured to receive the second pull-down control signal VDD_1. The output terminal of the twenty-third switching transistor T23 is connected to an input terminal of the twenty-fourth switching transistor T24 and a control terminal of the twenty-fifth switching transistor T25. A control terminal of the twenty-fourth switching transistor T24 is connected to the second point Q2, and an output terminal of the twenty-fourth switching transistor T24 is connected to the first low level voltage VSS2. An input terminal of the twenty-fifth switching transistor T25 is configured to receive the second pull-down control signal VDD_1, and an output terminal of the twenty-fifth switching transistor T25 is connected to the second pull-down point QB2, and configured to output a second pull-down signal. A control terminal of the twenty-sixth switching transistor T26 is configured to receive the second control signal, the input terminal of the twenty-sixth switching transistor T26 is connected to the second pull-down point QB2, and the output terminal of the twenty-sixth switching transistor T26 is connected to the first low level voltage VSS2. A control terminal of the twenty-seventh switching transistor T27 is configured to receive the first trigger signal Carry(n−4), an input terminal of the twenty-seventh switching transistor T27 is connected to the second pull-down point QB1, and an output terminal of the twenty-seventh switching transistor T27 is connected to the first low level voltage VSS2.

When the second pull-down control signal VDD_1 is at the high level, the twenty-third switching transistor T23 is turned on, and the twenty-fifth switching transistor T25 is turned on. The second pull-down point QB2 is at the high level, and the second pull-down signal is at the high level. When the second point Q2 is at the high level, the twenty-fourth switching transistor T24 is turned on, and the control terminal of the twenty-fifth switching transistor T25 is at the low level. The twenty-fifth switching transistor T25 is turned off, and the control terminal of the twenty-sixth switching transistor T26 is at the high level. The twenty-sixth switching transistor T26 is turned on, and the second pull-down point QB2 is at the low level. Thus, the situation that the second control signal is at the high level while the second pull-down signal is at the low level is realized, and the pulling down of the voltages of the third output signal Gout(n+2), the fourth output signal Gout(n+3) and the second point Q2 is stopped.

When the first trigger signal Carry(n−4) received by the control terminal of the twenty-seventh switching transistor T27 is at the high level, the twenty-seventh switching transistor T27 is turned on, and the second pull-down point QB2 is at the low level, which further ensures that the second pull-down point QB2 is at the low level when the second point Q2 is at the high level.

Further, the second pull-down sub-circuit 422 includes a twenty-eighth switching transistor T28, a twenty-ninth switching transistor T29, and a thirtieth switching transistor T30.

A control terminal of the twenty-eighth switching transistor T28 is connected to the second pull-down point QB2, and configured to receive the second pull-down signal, an input terminal of the twenty-eighth switching transistor T28 is connected to the second point Q2, and an output terminal of the twenty-eighth switching transistor T28 is connected to the first low level voltage VSS2.

A control terminal of the twenty-ninth switching transistor T29 is connected to the second pull-down point QB2, and configured to receive the second pull-down signal, an input terminal of the twenty-ninth switching transistor T29 is connected to the output terminal of the third output circuit 220, and an output terminal of the twenty-ninth switching transistor T29 is connected to the second low level voltage VSS1.

A control terminal of the thirtieth switching transistor T30 is connected to a second pull-down point QB2, and configured to receive the second pull-down signal, an input terminal of the thirtieth switching transistor T30 is connected to the output terminal of the fourth output circuit 320, and an output terminal of the thirtieth switching transistor T30 is connected to the second low level voltage VSS1.

Further, the second pull-down sub-circuit 422 includes a thirty-first switching transistor T31. A control terminal of the thirty-first switching transistor T31 is configured to receive a second pull-down trigger signal Carry(n+5), an input terminal of the thirty-first switching transistor T31 is connected to the second point Q2, and an output terminal of the thirty-first switching transistor T31 is connected to a first low level voltage VSS2.

When the second pull-down trigger signal Carry(n+5) is at the high level, the thirty-first switching transistor T31 is turned on, and the voltage at the second point Q2 is pulled down to the low level. When the second pull-down point QB2 is at the high level, that is, the second pull-down signal is at the high level, the twenty-eighth switching transistor T28 is turned on, and the voltage at the second point Q2 is pulled down. The twenty-ninth switching transistor T29 is turned on, the voltage at the output terminal of the third output circuit 220 is pulled down to the low level. The thirtieth switching transistor T30 is turned on, and the voltage at the output terminal of the fourth output circuit 320 is pulled down to the low level.

Further, the second pull-down holding circuit 412 includes a thirty-second switching transistor T32. A control terminal of the thirty-second switching transistor T32 is connected to the first point Q1, and configured to receive the first control signal, an input terminal of the thirty-second switching transistor T32 is connected to the input terminal of the twenty-fourth switching transistor T24, and an output terminal of the thirty-second switching transistor T32 is connected to the output terminal of the twenty-fourth switching transistor T24.

Further, the second pull-down sub-circuit 422 includes a thirty-third switching transistor T33, a thirty-fourth switching transistor T34, and a thirty-fifth switching transistor T35.

A control terminal of the thirteenth switching transistor T33 is connected to the first pull-down point QB1, and configured to receive the first pull-down signal, an input terminal of the thirty-third switching transistor T33 is connected to the second point Q2, and the output terminal of the thirty-third switching transistor T33 is connected to the first low level voltage VSS2.

A control terminal of the thirty-fourth switching transistor T34 is connected to the first pull-down point QB1, and configured to receive the first pull-down signal, an input terminal of the thirty-fourth switching transistor T34 is connected to the output terminal of the third output circuit 220, and an output terminal of the thirty-fourth switching transistor T34 is connected to the second low level voltage VSS1.

A control terminal of the thirty-fifth switching transistor T35 is connected to the first pull-down point QB1, and configured to receive the first pull-down signal, an input terminal of the thirty-fifth switching transistor T35 is connected to the output terminal of the fourth output circuit 320, and an output terminal of the thirty-fifth switching transistor T35 is connected to the second low level voltage VSS1.

When the first pull-down point QB1 is at the high level, that is, the first pull-down signal is at the high level, the thirteenth switching transistor T33 is turned on, and the voltage at the second point Q2 is pulled down. The thirty-fourth switching transistor T34 is turned on, the voltage at the output terminal of the third output circuit 220 is pulled down to the low level. The thirty-fifth switching transistor T35 is turned on, and the voltage at the output terminal of the fourth output circuit 320 is pulled down to the low level.

In summary, when the first control signal or the second control signal is at the high level, the voltages at the first pull-down point QB1 and the second pull-down point QB2 can be pulled down to the low level, thereby the pulling down of the voltages at the output terminals of the first output circuit 210, the second output circuit 310, the third output circuit 220, and the fourth output circuit 320 is stopped. When the first pull-down signal or the second pull-down signal is at the high level, the first pull-down point QB1 or the second pull-down point QB2 is at the high level, and the pull-down sub-circuit pulls down the voltages at the output terminals of the first output circuit 210, the second output circuit 310, the third output circuit 220 and the fourth output circuit 320.

Further, the second driving circuit includes a second reset circuit. The second reset circuit includes a reset switching transistor T36. A control terminal of the reset switching transistor T36 is configured to receive a reset signal Reset, an input terminal of the reset switching transistor T36 is connected to the second point Q2, and an output terminal of the reset switching transistor T20 is connected to the first low level voltage VSS2.

When the reset signal Reset is at the high level, the reset switching transistor T36 is turned on, and the voltage at the second point Q2 is pulled down to the low level.

Referring to FIG. 5 to FIG. 8, the process of implementing the Gout gate signal output in this embodiment may be divided into four stages.

Figure 5:
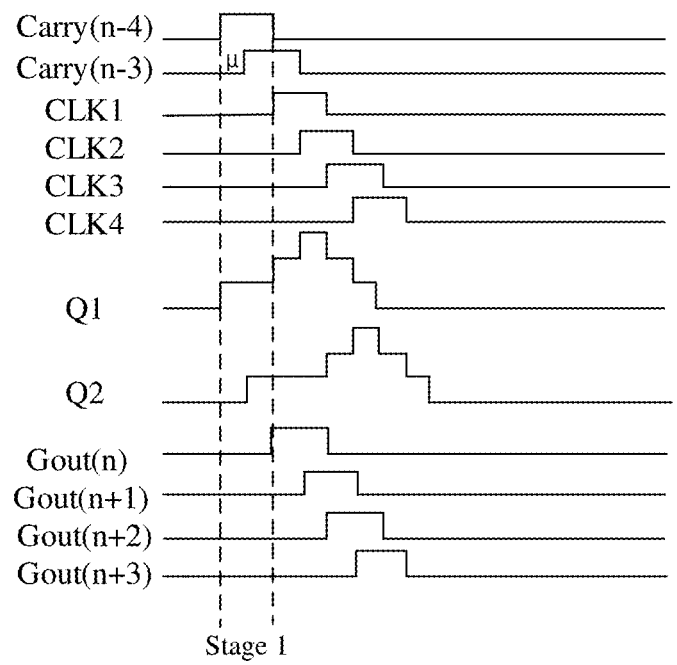
FIG. 5 is a schematic control timing diagram of a first stage of the four-stage driving circuit according to the embodiment of the present application.

Stage 1. As shown in FIG. 5, VGH is set to be 30 V, and VGL is set to be −15 V.

Carry(n−4) is at the high level VGH, and VDD is a DC high voltage VGH. At this time, the first switching transistor T1 is turned on, the first point Q1 is at the high level VGH. The second switching transistor T2 is turned on, the third switching transistor T3 is turned on, the second switching transistor T2 receives the voltage of the first clock signal CLK1, and the third switching transistor T3 receives the voltage of CLK2. At this time, the voltages of CLK1 and CLK2 are VGL, that is, the voltage VGout(n) of the first output signal and the voltage VGout(n+1) of the second output signal are −15 V. At this time, the voltage difference between two terminals of each of the capacitors C1 and C2 is 45 V. Carry(n−3) is at the low level during the μ time, and accordingly the nineteenth switching transistor T19 is turned off, and the voltage at the second point Q2 is the low voltage VGL. After a period of time, Carry (n−3) is at the high level, and the nineteenth switching transistor T19 is turned on. The voltage at the second point Q2 is the high voltage VGH. At this time, the voltage of the second output signal Gout(n+2) and the voltage of the fourth output signal Gout (n+3) are VGL.

Figure 6:
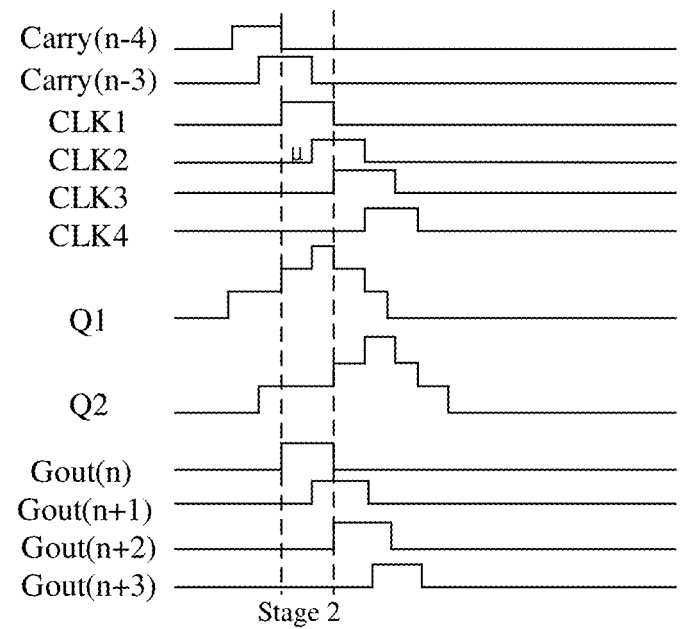
FIG. 6 is a schematic control timing diagram of a second stage of the four-stage driving circuit according to the embodiment of the present application.

Stage 2. As shown in FIG. 6, Carry(n−4) is switched to the low level VGL. At this time, the first switching transistor T1 of the first input circuit 110 is turned off, a time interval between the CLK1 switching to the high level and the CLK2 switching to the high level is μ. During the μ time, the second switching transistor T2 is maintained to be turned on due to a holding effect of the first capacitor C1. At this time the CLK1 is switched to the high level VGH. Because the coupling of the capacitor C1, the voltage at the first point Q1 rises to VGH+ΔV (ΔV is VGH−VGL in theory). The voltage at the first point Q1 is a high voltage. The second switching transistor T2 and the third switching transistor T3 are turned on at this time, and the second switching transistor T2 receives the high voltage of CLK1, that is, VGout(n) is at the high level VGH. The third switching transistor T3 receives the low voltage of CLK2, that is, VGout(n+1) is VGL. After p time, CLK2 is switched to the high level VGH, that is, VGout (n+1) is VGH, and a voltage variation at the first point Q1 is also ΔV, that is, VGout (n+1) is the high voltage VGH, and VGout (n) is the high voltage VGH. In this stage CLK3, CLK4 are at both the low level VGL, that is, VGout(n+2), and VGout (n+3) are both at the low voltage VGL.

Figure 7:
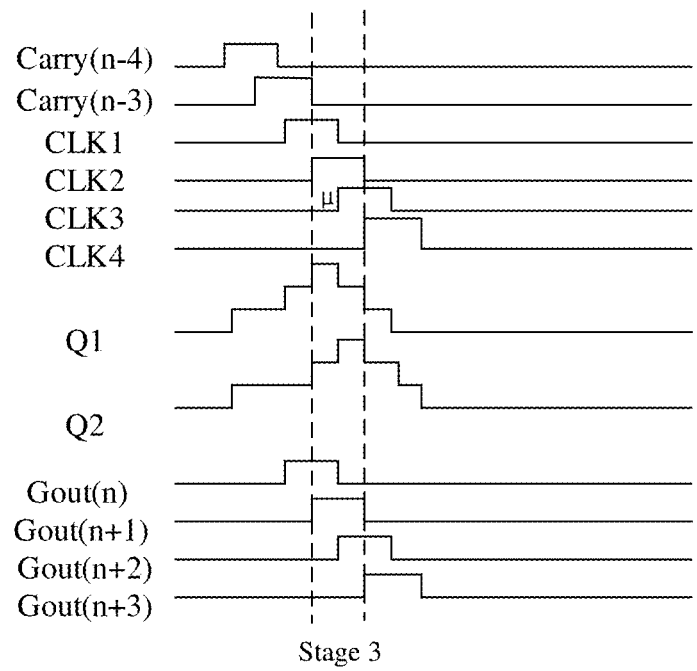
FIG. 7 is a schematic control timing diagram of a third stage of the four-stage driving circuit according to the embodiment of the present application.

Stage 3. As shown in FIG. 7, during the stage 2, the CLK2 is switched to the high level, the VGout(n+1) is the high voltage. After p time, the CLK3 is switched to the high level, the voltage variation at the second point Q2 is ΔV, that is, the voltage at the second point Q2 is VGH+ΔV, that is, Gout (n+3) is at the high level VGH, and CLK4 is switched to the low voltage, that is, VGout(n+3) is the low voltage VGL.

Figure 8:
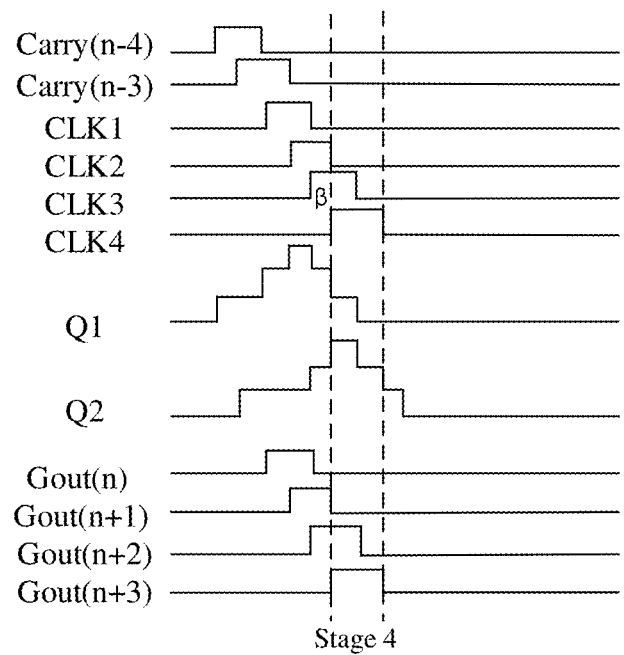
FIG. 8 is a schematic control timing diagram of a fourth stage of the four-stage driving circuit according to embodiment of the present application.

Stage 4. As shown in FIG. 8, during 0 time, CLK2 is at the low level, the voltage variation at the first point Q1 is −ΔV, that is, the voltage at the first point Q1 is VGH+ΔV, the voltage of the CLK 3 remains unchanged, and the voltage at the second point Q2 remains unchanged. After the β time, CLK3 is at the low level, the voltage variation at the second point Q2 is ΔV, that is, the voltage at the second point Q2 is VGH+ΔV. CLK4 is at the high level, that is, the third output signal Gout(n+3) is at the high level VGH. The eighth switching transistor T8 and the fourteenth switching transistor T14 are turned on, and the first pull-down point QB1 receives the VSS1, namely the low voltage VGL.

It should be noted that, in specific implementation, the four-stage driving circuit may be one output circuit, and in fact the driving circuit includes a plurality of four-stage driving circuits.

In this embodiment, the four-stage output only uses 36 TFTs. Compared with the related art which requires at least 68 TFTs to realize the four-stage output, a large number of TFTs are saved, the area of the driving circuit is greatly reduced, the frame of the display product is reduced, and meanwhile, the design and manufacturing cost is saved.

Figure 9:
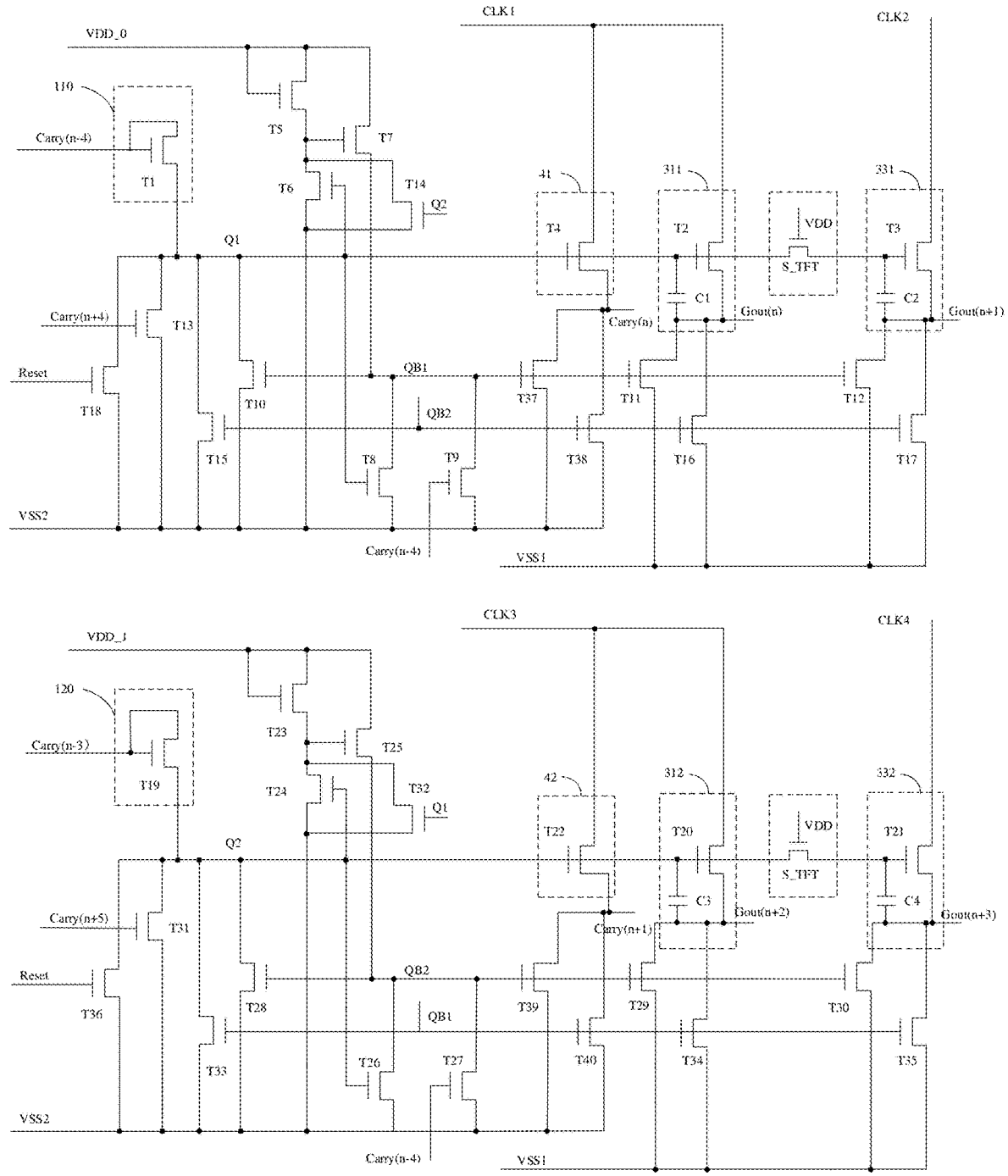
FIG. 9 is a schematic circuit diagram of the four-stage driving circuit according to another embodiment of the present application.
Figure 10:
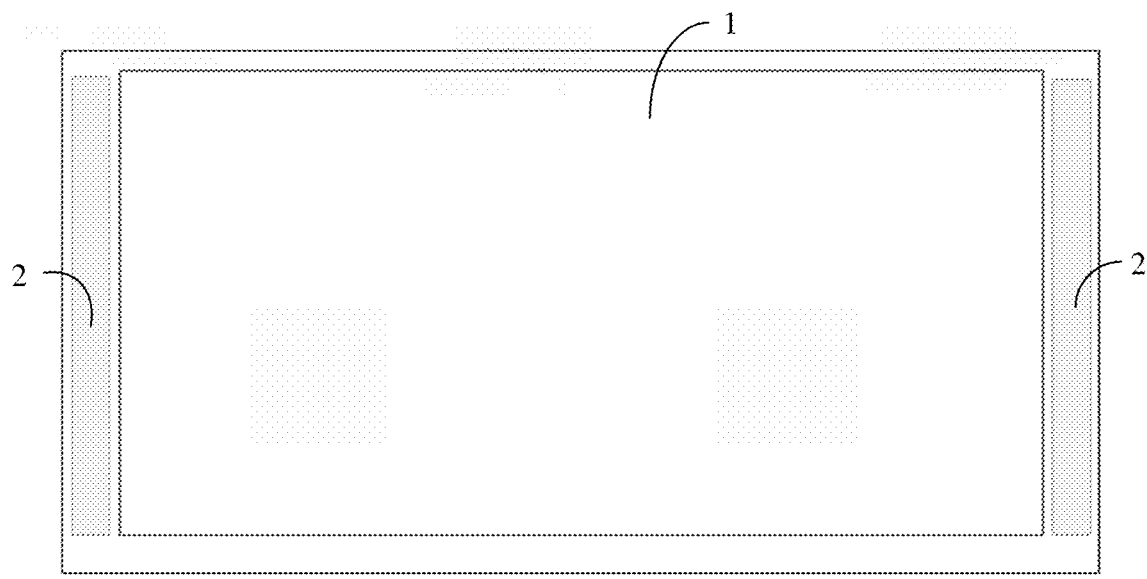
FIG. 10 is a schematic structural diagram of a display panel according to another embodiment of the present disclosure.

With reference to FIG. 9, another embodiment of the four-stage circuit of the present application is different from the previous embodiment. In this embodiment, the first pull-down sub-circuit 421 further includes a thirty-seventh switching transistor T37 and a thirty-eighth switching transistor T38. A control terminal of the thirty-seventh switching transistor T37 is connected to the first pull-down point QB1 and configured to receive the first pull-down signal, an input terminal of the third-seventh switching transistor T37 is connect to the output terminal of the first cascading down circuit 510, and an output terminal of the thirty-seventh switching transistor T37 is connected to the first low level voltage VSS2. A control terminal of the thirty-eighth switching transistor T38 is connected to the second pull-down point QB2 and configured to receive the second pull-down signal, an input terminal of the thirty-eighth switching transistor T38 is connected to the output terminal of the first cascading down circuit 510, and an output terminal of the thirty-eighth switching transistor T38 is connected to the first low level voltage VSS2.

The second pull-down sub-circuit 422 further includes a thirty-ninth switching transistor T39 and a fortieth switching transistor T40. A control terminal of the thirty-ninth switching transistor T39 is connected to the first pull-down point QB1 and configured to receive the first pull-down signal, an input terminal of the thirty-ninth switching transistor T39 is connected to the output terminal of the second cascading down circuit 520, and an output terminal of the thirty-ninth switching transistor T39 is connected to the first low level voltage VSS2. A control terminal of the fortieth switching transistor T40 is connected to the second pull-down point QB2 and configured to receive the second pull-down signal, an input terminal of the fortieth switching transistor T40 is connected to the output terminal of the second cascading down circuit 520, and an output terminal of the fortieth switching transistor T40 is connected to the first low level voltage VSS2.

In this embodiment, when the first pull-down point QB1 is at the high level, the thirty-seventh switching transistor T37 and the thirty-ninth switching transistor T39 are turned on, and accordingly the voltages of the cascading-down signals are pulled down. When the second pull-down point QB2 is at the high level, both the thirty-eighth switching transistor T38 and the fortieth switching transistor T40 are turned on, and accordingly the voltage of the cascading-down signals are pulled down. Therefore, when the first pull-down point QB1 or the second pull-down point QB2 is at the high level, the voltages of the cascading-down signals are pulled down.

The present disclosure further provides a display panel. Referring to FIG. 14, in an embodiment, the display panel includes a display area 1 and a non-display area 2, the display area 1 is provided with a plurality of pixel units, and the display panel further includes:
- a driving circuit disposed on the non-display area 2 to output a driving signal to drive the plurality of pixel units, the driving circuit being configured as the driving circuit described above; or
- a four-stage driving circuit arranged on the non-display area 2 to output a driving signal to drive the plurality of pixel units, the four-stage driving circuit being configured as the four-stage driving circuit described above.

The structure of the driving circuit and the structure of the four-stage driving circuit may refer to the above embodiments, and details are not described herein again. It should be understood that, since the display panel of the present embodiment adopts the technical solutions of the above driving circuit or the above four-stage driving circuit, the display panel has all the beneficial effects of the driving circuit or the four-stage driving circuit, an area of the substrate is reduced and the frame of the display panel is narrowed.

The above is only an optional embodiment of the present application, and is not therefore limiting the scope of the present application. Any equivalent structural transformation made by using the contents of the specification and drawings of the present application or any direct or indirect application in other related technical fields under the inventive concept of the present application is included in the claimed scope of the present application.

What is claimed is:

1. A driving circuit, comprising:
   an input circuit configured to output a control signal upon receiving a trigger signal;
   a first output circuit comprising a control terminal connected to an output terminal of the input circuit, and configured to output a first output signal upon receiving the control signal and a first input signal;
   a second output circuit comprising a control terminal connected to the output terminal of the input circuit and configured to output a second output signal upon receiving the control signal and a second input signal; and
   a pull-down circuit comprising:
      an input terminal connected to the output terminal of the input circuit, an output terminal of the first output circuit and an output terminal of the second output circuit; and
      an output terminal connected to a first low level voltage and configured to pull down the control signal, the first output signal and the second output signal to a low level when a pull-down control signal is at a high level, and stop pulling down the control signal, the first output signal and the second output signal when the trigger signal or the control signal is at the high level,
   wherein the pull-down circuit comprises:
   a pull-down holding circuit comprising an input terminal connected to the output terminal of the input circuit, and the pull-down holding circuit being configured to output a pull-down signal according to the pull-down control signal, and pull down the pull-down signal according to the trigger signal and the control signal; and
   a pull-down sub-circuit comprising:
      a control terminal connected to the output terminal of the pull-down holding circuit;
      an input terminal connected to the output terminal of the input circuit, the output terminal of the first output circuit and the output terminal of the second output circuit; and
      an output terminal connected to the first low level voltage, and configured to pull down the control signal, the first output signal and the second output signal to the low level upon receiving the pull-down signal.

2. The driving circuit according to claim 1, wherein the input circuit comprises a first switching transistor, and the first switching transistor comprises:
   a control terminal configured to receive the trigger signal;
   an input terminal connected to the control terminal; and
   an output terminal connected to the control terminal of the first output circuit, the control terminal of the second output circuit, and the input terminal of the pull-down circuit.

3. The driving circuit according to claim 1, wherein,
   the first output circuit comprises:
      a second switching transistor comprising:
         a control terminal connected to the output terminal of the input circuit;
         an input terminal configured to receive the first input signal; and
         an output terminal configured to output the first output signal; and
   the second output circuit comprises:
      a third switching transistor comprising:
         a control terminal connected to the output terminal of the input circuit;
         an input terminal configured to receive the second input signal; and
         an output terminal configured to output the second output signal.

4. The driving circuit according to claim 3, wherein,
   the first output circuit further comprises a first capacitor, one terminal of the first capacitor is connected to the control terminal of the second switching transistor, and another terminal of the first capacitor is connected to the output terminal of the second switching transistor; and the second output circuit further comprises a second capacitor, one terminal of the second capacitor is connected to the control terminal of the third switching transistor, and another terminal of the second capacitor is connected to the output terminal of the third switching transistor.

5. The driving circuit according to claim 1, wherein the driving circuit further comprises a cascading-down circuit having a control terminal connected to the output terminal of the input circuit, and the cascading-down circuit is configured to output a cascading-down signal upon receiving the control signal and the first input signal.

6. The driving circuit according to claim 5, wherein the cascading-down circuit comprises a fourth switching transistor comprising:
   a control terminal connected to the output terminal of the input circuit;
   an input terminal of the fourth switching transistor configured to receive the first input signal; and
   an output terminal configured to output the cascading-down signal.

7. The driving circuit according to claim 1, wherein the pull-down holding circuit comprises:
   a fifth switching transistor comprising:
      a control terminal configured to receive the pull-down control signal;
      an input terminal connected to the control terminal; and
      an output terminal; and
   a sixth switching transistor comprising:
      an input terminal connected to the output terminal of the fifth switching transistor;
      a control terminal connected to the output terminal of the input circuit; and
      an output terminal connected to the first low level voltage;
   a seventh switching transistor comprising:
      a control terminal connected to the output terminal of the fifth switching transistor;
      an input terminal configured to receive the pull-down control signal; and
      an output terminal configured to output the pull-down signal;
   an eighth switching transistor comprising:
      a control terminal configured to receive the control signal;
      an input terminal connected to the output terminal of the seventh switching transistor; and
   a ninth switching transistor comprising:
      a control terminal configured to receive the trigger signal;
      an input terminal connected to the output terminal of the seventh switching transistor; and
      an output terminal connected to the first low level voltage.

8. The driving circuit according to claim 1, wherein the pull-down sub-circuit comprises:
   a tenth switching transistor comprising:
      a control terminal configured to receive the pull-down signal;
      an input terminal connected to the output terminal of the input circuit; and
      an output terminal connected to the first low level;
   an eleventh switching transistor comprising:
      a control terminal configured to receive the pull-down signal;
      an input terminal connected to the output terminal of the first output circuit;
      an output terminal connected to a second low level; and
   a twelfth switching transistor comprising:
      a control terminal configured to receive the pull-down signal;
      an input terminal connected to the output terminal of the second output circuit; and
      an output terminal connected to the second low level.

9. The driving circuit according to claim 8, wherein the pull-down sub-circuit further comprises a thirteenth switching transistor, and the thirteenth switching transistor comprises:
   a control terminal configured to receive a first pull-down trigger signal;
   an input terminal connected to the output terminal of the input circuit; and
   an output terminal connected to the first low level.

10. The driving circuit according to claim 1, wherein the pull-down sub-circuit further comprises a fourteenth switching transistor, and the fourteenth switching transistor comprises:
    a control terminal configured to receive the pull-down signal;
    an input terminal connected to an output terminal of the cascading-down circuit; and
    an output terminal connected to the first low level voltage.

11. The driving circuit according to claim 1, wherein the driving circuit further comprises a reset circuit, the reset circuit comprises a reset switching transistor and the reset switching transistor comprises:
    a control terminal configured to receive a reset signal;
    an input terminal connected to the output terminal of the input circuit; and
    an output terminal connected to the first low level voltage.

12. A display panel, comprising a display area and a non-display area, wherein the display area is provided with a plurality of pixel units, and the display panel further comprises the driving circuit according to claim 1, and the driving circuit is arranged on the non-display area to output a driving signal to drive the plurality of pixel units.

13. A driving circuit, comprising:
    an input circuit configured to output a control signal upon receiving a trigger signal;
    a first output circuit comprising a control terminal connected to an output terminal of the input circuit, and configured to output a first output signal upon receiving the control signal and a first input signal;
    a second output circuit comprising a control terminal connected to the output terminal of the input circuit and configured to output a second output signal upon receiving the control signal and a second input signal; and
    a pull-down circuit comprising:
       an input terminal connected to the output terminal of the input circuit, an output terminal of the first output circuit and an output terminal of the second output circuit; and
       an output terminal connected to a first low level voltage and configured to pull down the control signal, the first output signal and the second output signal to a low level when a pull-down control signal is at a high level, and stop pulling down the control signal, the first output signal and the second output signal when the trigger signal or the control signal is at the high level;
    wherein the pull-down circuit further comprises:
       a pull-down holding circuit comprising:
          a fifth switching transistor comprising:

a control terminal configured to receive the pull-down control signal;
an input terminal connected to the control terminal; and
an output terminal; and
a sixth switching transistor comprising:
an input terminal connected to the output terminal of the fifth switching transistor;
a control terminal connected to the output terminal of the input circuit; and
an output terminal connected to the first low level voltage;
a seventh switching transistor comprising:
a control terminal connected to the output terminal of the fifth switching transistor;
an input terminal configured to receive the pull-down control signal; and
an output terminal configured to output the pull-down signal; and
an eighth switching transistor comprising:
a control terminal configured to receive the control signal;
an input terminal connected to the output terminal of the seventh switching transistor; and
a ninth switching transistor comprising:
a control terminal configured to receive the trigger signal;
an input terminal connected to the output terminal of the seventh switching transistor; and
an output terminal connected to the first low level voltage.

14. A four-stage driving circuit, comprising:
a first driving circuit comprising:
a first input circuit configured to output a first control signal upon receiving a first trigger signal;
a first output circuit comprising a control terminal connected to an output terminal of the first input circuit and configured to output a first output signal upon receiving the first control signal and a first input signal;
a second output circuit comprising a control terminal connected to the output terminal of the first input circuit and configured to output a second output signal upon receiving the first control signal and a second input signal are received; and
a first pull-down circuit comprising:
an input terminal connected to the output terminal of the first input circuit, an output terminal of the first output circuit and an output terminal of the second output circuit; and
an output terminal connected to a first low level voltage, and configured to pull the first control signal, the first output signal and the second output signal to a low level when a first pull-down control signal is at a high level, and stop pulling down the first control signal, the first output signal and the second output signal when the second control signal or the first control signal is at the high level; and
a second driving circuit comprising:
a second input circuit configured to output a second control signal upon receiving a second trigger signal;
a third output circuit comprising a control terminal connected to an output terminal of the second input circuit and configured to output a third output signal upon receiving the second control signal and a third input signal;
a fourth output circuit comprising a control terminal connected to the output terminal of the second input circuit and configured to output a fourth output signal upon receiving the second control signal and a fourth input signal;
a second pull-down circuit comprising:
an input terminal connected to the output terminal of the second input circuit, an output terminal of the third output circuit, and an output terminal of the fourth output circuit; and
an output terminal connected to the first low level voltage, and configured to pull down the second control signal, the third output signal and the fourth output signal to the low level when a second pull-down control signal is at the high level, and stop pulling down the second control signal, the third output signal and the fourth output signal when the first trigger signal, the second control signal or the first control signal is at the high level, the first pull-down control signal and the second pull-down control signal being opposite in voltage level.

15. A display panel, comprising a display area and a non-display area, wherein the display area is provided with a plurality of pixel units, and the display panel further comprises the driving circuit according to claim 13, and the driving circuit is arranged on the non-display area to output a driving signal to drive the plurality of pixel units.

16. A display panel, comprising a display area and a non-display area, wherein the display area is provided with a plurality of pixel units, and the display panel further comprises the four-stage driving circuit according to claim 14, and the four-stage driving circuit is arranged on the non-display area to output a driving signal to drive the plurality of pixel units.

* * * * *